United States Patent [19]
Schirbl et al.

[11] Patent Number: 5,791,916
[45] Date of Patent: Aug. 11, 1998

[54] ENCLOSED INPUT/OUTPUT MODULE

[75] Inventors: Reinhard Schirbl, Schwandorf; Werner Meiler, Ebermannsdorf; Guenther Deinhardt, Amberg, all of Germany

[73] Assignee: Siemens Aktiengesellschaft, München, Germany

[21] Appl. No.: 635,268

[22] Filed: Apr. 19, 1996

[30] Foreign Application Priority Data

Apr. 21, 1995 [DE] Germany .................. 195 14 767.7

[51] Int. Cl.$^6$ .................... H01R 23/72; H05K 7/10
[52] U.S. Cl. .................... 439/76.1; 361/736; 439/364
[58] Field of Search .................... 439/76.1, 709, 439/357, 358, 364, 680, 61; 361/736

[56] References Cited

U.S. PATENT DOCUMENTS

| | | | |
|---|---|---|---|
| 3,977,748 | 8/1976 | Gruhn et al. | 439/680 |
| 4,008,941 | 2/1977 | Smith | 439/358 |
| 4,179,179 | 12/1979 | Lowden | 439/364 |
| 5,043,847 | 8/1991 | Deinhardt et al. | 361/736 |
| 5,486,117 | 1/1996 | Chang | 439/357 |

FOREIGN PATENT DOCUMENTS

| | | |
|---|---|---|
| 2108201 | 4/1994 | Canada . |
| 0 162 373 | 11/1985 | European Pat. Off. . |
| 0 550 324 | 7/1993 | European Pat. Off. . |
| 0 592 712 | 4/1994 | European Pat. Off. . |
| 35 35 971 | 4/1988 | Germany . |
| 93 14 097 | 1/1994 | Germany . |

Primary Examiner—Neil Abrams
Attorney, Agent, or Firm—Kenyon & Kenyon

[57] ABSTRACT

An enclosed input/output module comprising an enclosure (1), at least one printed circuit board (2) arranged along one of the interior surfaces of the enclosure, a cover (3) having an essentially U-shaped receiving channel (4) including a pair of hollow legs, and a process connector (5) that fits within the receiving channel of the cover, wherein the module comprises a second printed circuit board such that the two printed circuit boards fit into the legs of the cover to frame the receiving channel on both sides and both printed circuit boards are free of mounted components, apart from light-emitting diodes, in the portions that frame the receiving channel. The module may additionally include light-emitting diodes (6) on the circuit boards (2), optical waveguides (7), latching elements and recesses (25, 26) for retaining the process connector (5) with respect to the cover (3) in a preliminary position, and/or threaded means (17, 18) for fully joining the process connector (5) to the cover (3). The process connector (5) includes contacts (12) for engagement with blades (9) on the printed circuit boards (2) and screw terminals (14) for connection to wires. The module may additionally include encoding and counter-encoding elements (19, 20) for ensuring a proper match between the process connector (5) and cover (3) and guide bars and grooves (23, 24) asymmetrically designed and/or arranged for ensuring the proper orientation and for guidance of the process connector (5) into the cover (3).

21 Claims, 6 Drawing Sheets

ENCLOSED INPUT/OUTPUT MODULE

FIELD OF THE INVENTION

This invention relates to an input/output module in which the printed circuit boards are free of mounting components in the area of a receiving channel so as to minimize the module width required for receiving a process connector or, given a particular module width, to maximize the width of the receiving channel.

BACKGROUND OF THE INVENTION

Input/output modules are generally described in EP 0 592 712 A1, the text of which is hereby incorporated by reference. In devices of this general type, the enclosed input/output module comprises an essentially U-shaped receiving channel arranged on the front side of an enclosure for receiving a process connector to which data lines can be connected via connection elements, and a printed circuit board arranged in the enclosure that extends laterally with respect to the receiving channel.

SUMMARY OF THE INVENTION

The present invention is directed towards minimizing the module width required for receiving the process connector or, given a particular module width, maximizing the width of the receiving channel. This objective is achieved by using printed circuit boards that are free of mounted components in the portions of the printed circuit boards that extend toward the receiving channel area. The lack of components in that area has a marked effect on the module width if the module has two printed circuit boards that frame the receiving channel on both sides.

DETAILED DESCRIPTION OF THE INVENTION

Figure 1:
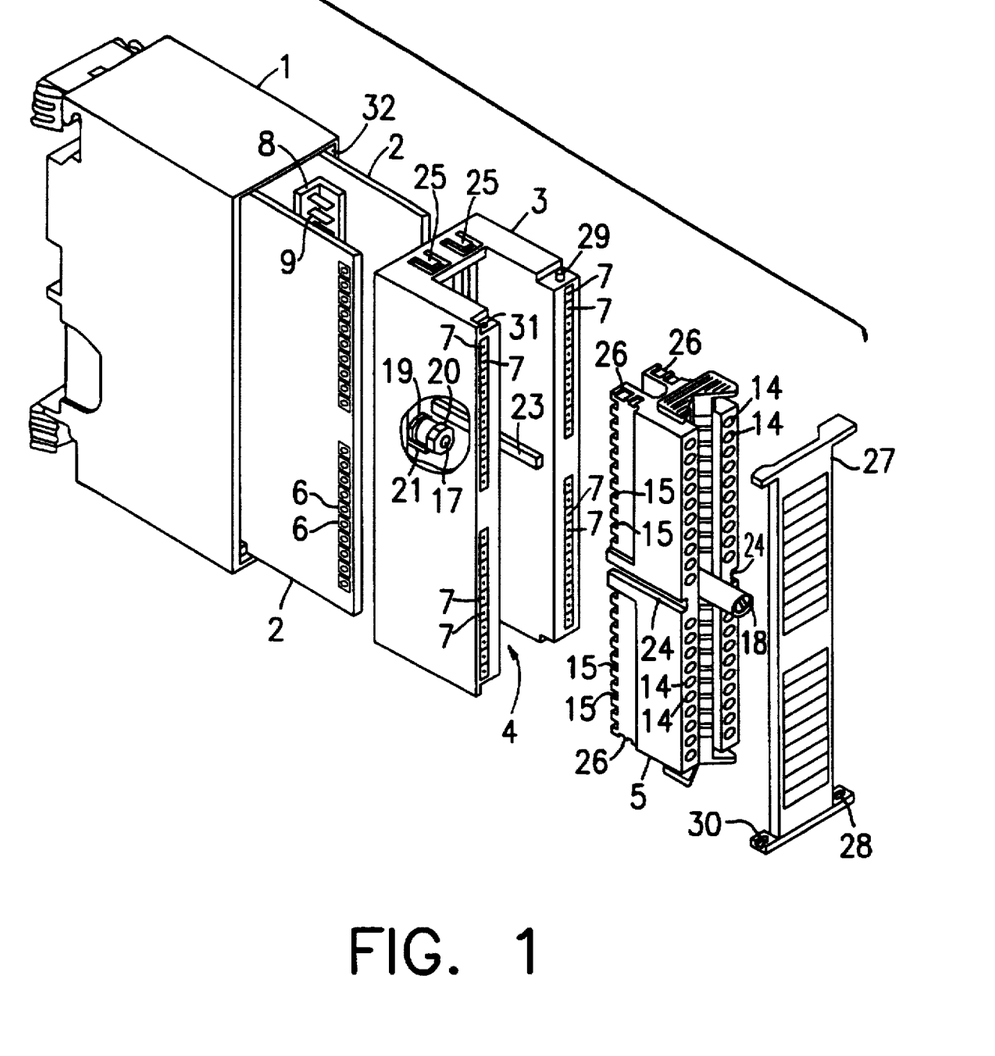
FIG. 1 illustrates an exploded view of an input/output module along with an associated process connector constructed according to the principles of the invention.

As illustrated in FIG. 1, the enclosed input/output module comprises an enclosure 1, which has a hollow interior and an open front side; printed circuit boards 2, which are inserted into the enclosure 1; and a cover 3, which has a front and rear portion and is placed over the printed circuit boards 2 and includes a U-shaped receiving channel 4 open to the front side of the enclosure 1.

The printed circuit boards 2 are arranged on the interior side walls 32 of the enclosure 1 and extend laterally with respect to the receiving channel 4. Thus, the printed circuit boards 2 can be viewed as appearing to "frame" the side boundaries of the receiving channel 4.

The process connector 5, which is also known as a front connector, has a back side 16 and front side and is placed within the receiving channel 4. A plurality of data lines, which are not shown, may be connected to the process connector 5. To maximize the available width of the receiving channel 4 and thus also the width of the process connector 5 for a given module width, components are not mounted onto the portion of the printed circuit boards 2 that extend towards the receiving channel 4. Thus, as shown by the dotted line in FIG. 1, the printed circuit boards 2 are free of components on the sides facing the receiving channel 4 to the right of the dotted line.

The printed circuit boards 2 include a plurality of SMD light-emitting diodes 6 located on the sides facing the interior side wall 32 of the enclosure 1. The light-emitting diodes 6 provide a means to display the status of signals that are transmitted via the data lines, which are connected to the process connector 5. Although the light-emitting diodes 6 are arranged near the front edge of the printed circuit boards 2, they are still set back from the front side of the module. Their light is transferred to the front side of the module in a known manner via optical waveguides 7, which are located on the front portion of the cover 3. (The mounting and mode of operation of the optical waveguides 7 is known and may be taken, for example, from DE 93 14 097 U, page 3, line 1 to page 4, line 31, the text of which is hereby incorporated by reference.) By arranging the light-emitting diodes 6 on the outside edges of the printed circuit boards 2, the optical waveguides 7 can be designed to have relatively short length, which minimizes optical losses.

Figure 2:
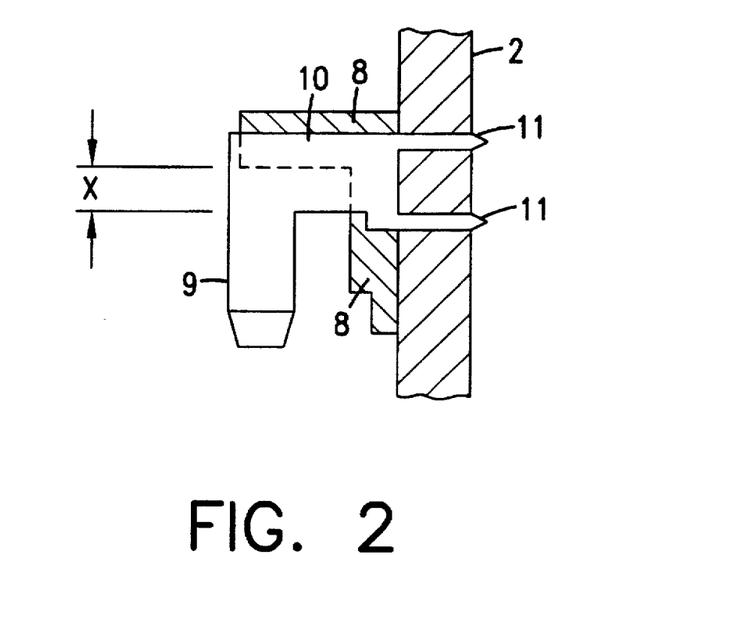
FIG. 2 illustrates a cut-away portion of one of the printed circuit boards of the module.

As illustrated in FIGS. 1 and 2, the printed circuit boards 2 have on their inner sides two multiple plug blocks 8, each having a plurality of contact blades 9. Only one multiple plug block 8 is shown in FIG. 1. The multiple plug blocks 8 are injection-molded parts made of plastic. Embedding the contact blades 9 in the multiple plug blocks 8 increases the stability of the contact blades 9. FIG. 2 illustrates that the contact blades 9 are joined via connecting elements 10 with contact pins 11, which are pressed into the printed circuit boards 2. The connecting elements 10 protrude over the multiple plug blocks 8 by the path length x.

Figure 3:
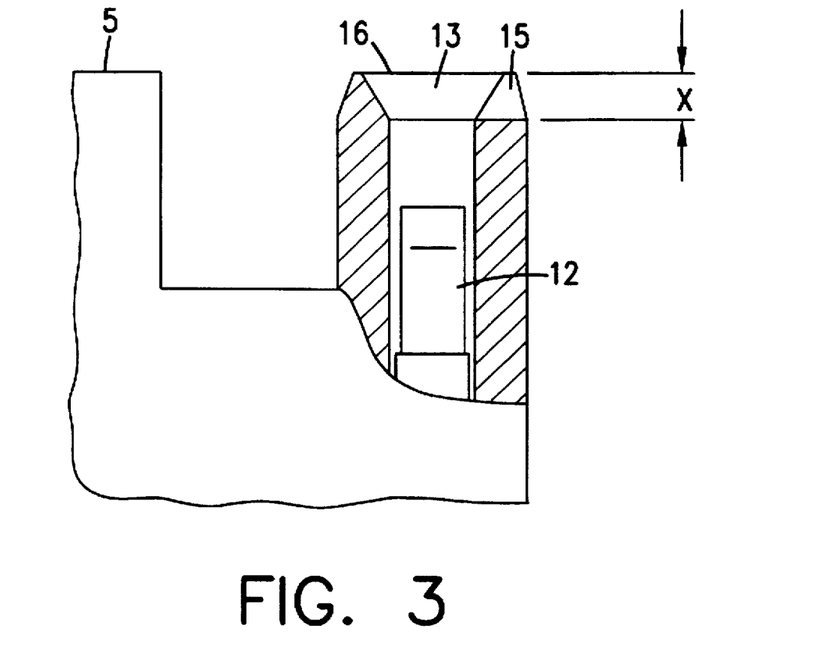
FIG. 3 illustrates a cut-away portion of the rear side of the process connector.

When the process connector 5 is completely inserted into the receiving channel 4, the contact blades 9, illustrated in FIG. 2, contact the corresponding counter-contacts 12, illustrated in FIG. 3. The counter-contacts 12 are arranged in multiple plug receptacles 13 on the rear portion of the process connector 5. The counter-contacts 12 are intended to provide an electrically conductive connection of the contact blades 9 with the corresponding connection elements 14, which are also arranged on both sides of the front side of the process connector 5, illustrated in FIG. 1 as screw terminals 14. Just as the multiple plug blocks 8 are arranged on both sides of the printed circuit boards 2, the multiple plug receptacles 13 are correspondingly arranged on both sides of the process connector 5.

As illustrated in FIG. 3, located on the outside of the multiple plug receptacles 13 and thus on the outside of the process connector 5 are recesses 15 that receive the connecting elements 10. The connecting elements 10 (shown in FIG. 2) protrude over the multiple plug blocks 8 and can thus enter the recesses 15 (shown in FIG. 3). As a result, the process connector 5 can be inserted into the receiving channel 4 such that the back side 16 of the process connector 5 touches the multiple plug blocks 8. The process connector 5 can thus be introduced further into the receiving channel 4 by the path x, with sufficient space for any required creepage paths and clearances between voltage-carrying contact parts of the process connector 5 and its outer contour.

As shown in FIG. 1, a tap hole 17 is accessible through the receiving channel 4 and is located centrally on the rear portion of the cover 3 and interacts with a threaded member 18 that is arranged on the process connector 5 in which it is axially immovably supported. The rotary motion of the threaded member 18 is thus transformed into linear motion of the process connector 5, thereby minimizing forces required to plug and unplug the process connector 5.

Figure 4:
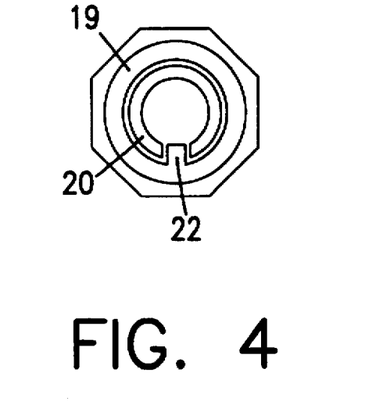
FIG. 4 illustrates a first embodiment of an encoding structure constructed according to the principles of the invention.

In the receiving channel 4, an encoding element 19 is securely arranged circumferentially about the tap hole 17 and is secured to the cover 3 using, for example, two latching hooks 21. For the sake of clarity only one of the latching hooks is shown. As illustrated in FIG. 4, the encoding element 19 is designed octagonally so that it can be inserted in eight different positions within the receiving channel 4. As illustrated in FIG. 1, a counter-encoding element 20 is detachably linked with the encoding element 19 (e.g., via flexible elements). This economical arrangement of the encoding elements requires little space. When the process connector 5 is first inserted into the receiving channel 4, the counter-encoding element 20 then latches in the process connector 5 around the threaded member 18 so that the process connector 5 is encoded when it is first plugged in. The encoding element 19 and counter-encoding element 20 are thus designed to be self-encoding. The counter-encoding element 20 latches in the process connector 5, for example, in a counter encoding element receptacle (not shown), which likewise has two latching hooks.

With the exception of actual encoding, the encoding element 19 and the counter-encoding element 20 are of corresponding construction, so that these two elements can also be installed in each other's previously described location. As a result, this interchangeability provides for a total of 16 (2×8) encodings.

Figure 5:
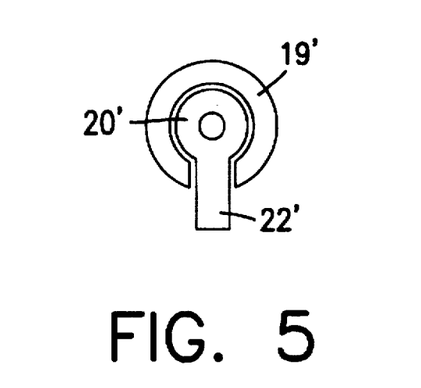
FIG. 5 illustrates a second embodiment of an encoding structure.

As illustrated in FIG. 4, the designs of the encoding element 19 and the counter-encoding element 20 are based on the key/lock principle. The key bit 22 is arranged such that it juts inward and not outward. As a result, the construction width of the encoding element 19 and counter-encoding element 20 is less than that of another possible configuration, shown in FIG. 5, in which the encoding element 19' and counter-encoding element 20' are designed such that the key bit 22' juts outward.

As shown in FIG. 1, when the process connector 5 is introduced into the receiving channel 4, the process connector 5 slides along two guide bars 23. (Only one of which is shown.) The guide bars 23 are arranged on the sides of the cover 3 facing the receiving channel 4 and slidably engage the corresponding guide grooves 24 of the process connector 5. The guide bars 23 are designed asymmetrically (i.e., of different geometry) so that the process connector 5 may be inserted into the receiving channel 4 in only a single position. Alternatively, to ensure that the process connector 5 is inserted correctly, the guide bars 23 could be arranged asymmetrically. This asymmetrical design or arrangement easily prevents the process connector 5 from being inserted into the receiving channel 4 when it is turned by 180°.

Figure 6:
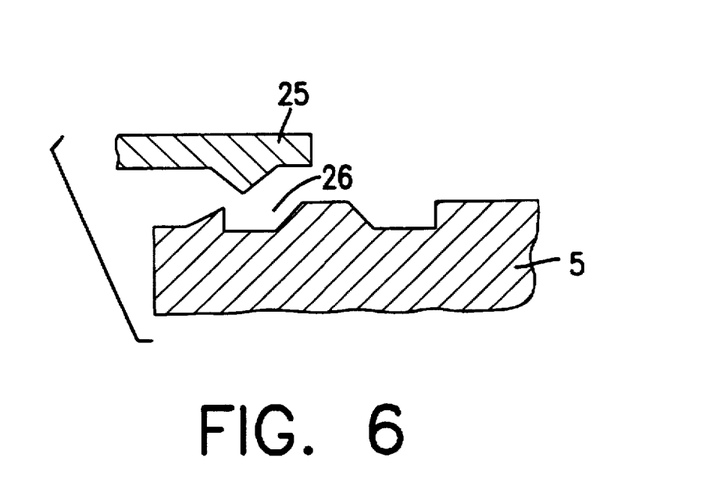
FIG. 6 illustrates the cooperation of the cover's latching mechanism with the process connector.
Figure 7:
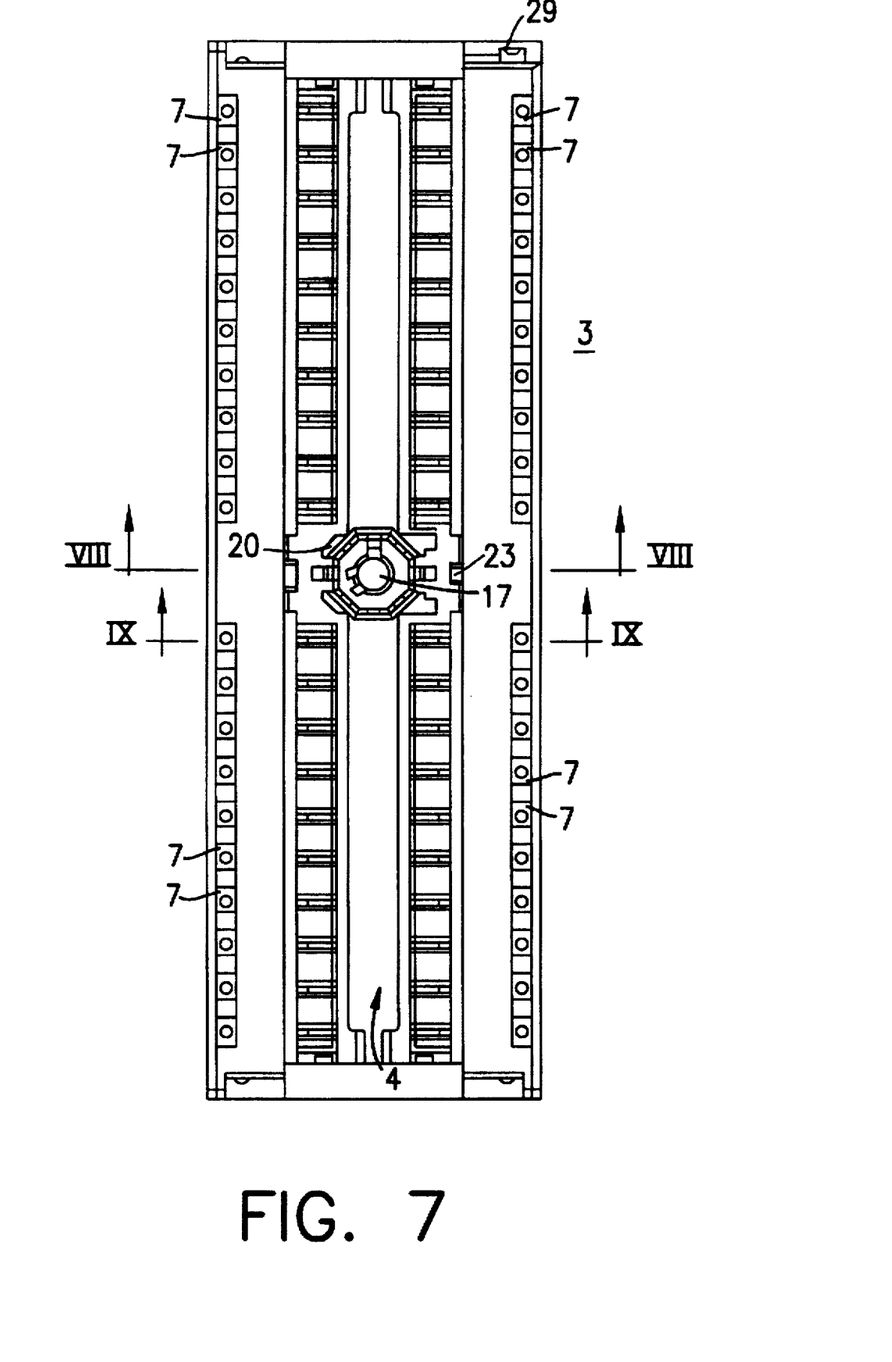
FIG. 7 illustrates a schematic front view of the cover shown in FIG. 1.
Figure 8:
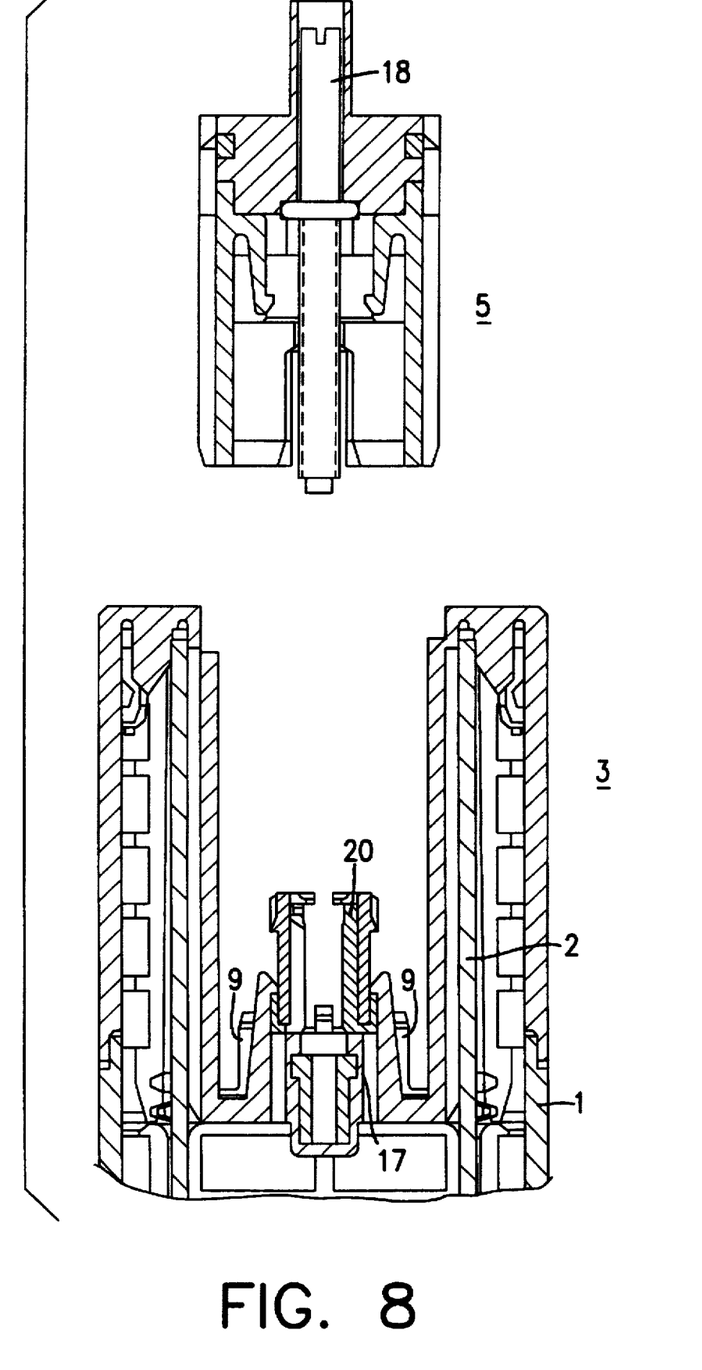
FIG. 8 illustrates a schematic cross-sectional view of the cover and process connector taken along section line VIII—VIII in FIG. 7.
Figure 9:
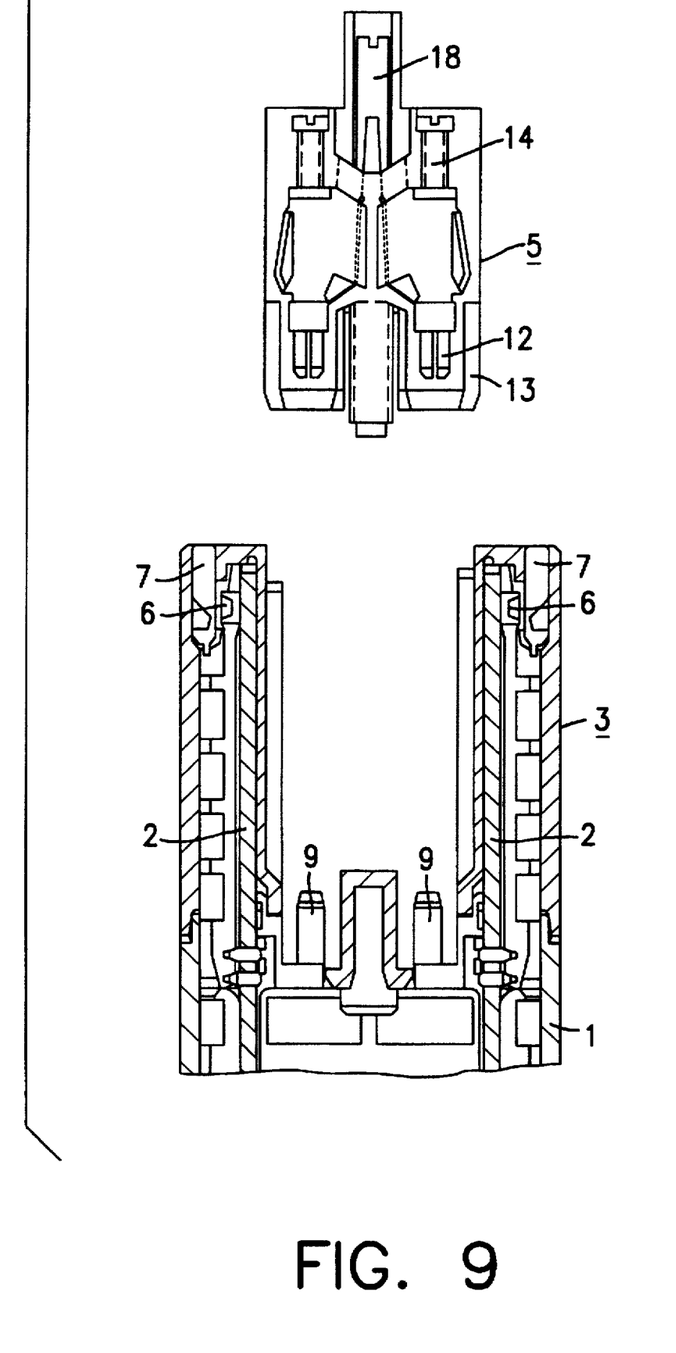
FIG. 9 illustrates a schematic cross-sectional view of the cover and process connector taken along section line IX—IX in FIG. 7.

When the process connector 5 is introduced into the receiving channel 4, the process connector 5 engages the cover 3 in a prelatching position. In the prelatching position, the contact blades 9 are electrically isolated from the counter-contacts 12. In the prelatching position, flexibly supported latching elements 25, which are arranged on the upper and lower end of the cover 3, engage latching recesses 26 on the process connector 5. As illustrated in FIG. 6, the latching elements 25 and the latching recesses 26 are beveled. As a result, the process connector 5 can be released from the prelatching position only through the application of force; actuating a release element is not required.

The axially immovably supported threaded member 18, the tap hole 17, the latching elements 25 and the latching recesses 26 are dimensioned such that the threaded member 18 just extends into the tap hole 17 in the prelatching position. As a result, the process connector 5 can only be inserted into its final position in the receiving channel 4 by actuating the bolt 18.

Additionally, the length of the encoding element 19 and counter-encoding element 20 are dimensioned such that it completes the introduction of the process connector 5 into the receiving channel 4 before the prelatching position is reached, which prevents the accidental destruction of the encoding structure due to the torque that is transformed via the bolt 18 into an axial displacement.

Finally, as illustrated in FIG. 1, a front cover 27 is designed as a labeling mask. The front cover 27 is attached by placing its cutouts 28 onto corresponding projections 29, which are located on the cover 3. The front cover 27 may then pivot about these projections 29. It latches in its end position when cut-outs 30, which are located on the front cover 27, engage projections 31, which are located on the cover 3, so that it covers the receiving channel 4.

The invention described above has many applications. One application is in an input and/or output module of a modularly built programmable controller.

What is claimed is:

1. An enclosed input/output module comprising:

an enclosure having sidewalls with exterior and interior surfaces, a back side and front side, wherein the enclosure is open on its front side;

at least one printed circuit board arranged along one of the interior surfaces of the enclosure;

a cover having an essentially U-shaped receiving channel and upper and lower ends; and a process connector that fits within the receiving channel of the cover, the process connector having front and back sides and providing connection elements to data lines;

wherein the module comprises a second printed circuit board such that the two printed circuit boards frame the receiving channel on both sides and both printed circuit boards are free of mounted components, apart from light-emitting diodes, in the portions that frame the receiving channel.

2. An enclosed input/output module as set forth in claim 1, wherein each printed circuit board includes light-emitting diodes that are arranged on the side of the printed circuit board facing the corresponding adjacent interior surface of the enclosure, wherein said light-emitting diodes display the status of the signals that are transmitted through the data lines.

3. An enclosed input/output module as set forth in claim 2, wherein the light-emitting diodes are SMD light-emitting diodes.

4. An enclosed input/output module as set forth in claim 2, wherein the light-emitting diodes are set back from the front side of the module, and further comprising optical waveguides that transfer light from the light-emitting diodes forwardly.

5. An enclosed input/output module as set forth in claim 1, wherein the module further comprises:
multiple plug blocks located on the sides of each printed circuit board that face the interior of the enclosure;
contact blades included on the multiple plug blocks; and
multiple plug receptacles located on the process connector having inner and outer sides, wherein the contact blades on the multiple plug blocks engage the corresponding multiple plug receptacles located on the process connector.

6. An enclosed input/output module as set forth in claim 5, wherein the module further comprises:
contact pins that are inserted into the printed circuit boards; and
connecting elements transverse to the contact pins that join the contact blades with the contact pins, the connecting elements protruding into the multiple plug blocks,
wherein the module further comprises recesses located on the outer sides of the multiple plug receptacles that correspond to the connecting elements such that the process connector can be inserted so far into the receiving channel that the multiple plug receptacles contact the multiple plug blocks when the process connector is inserted into the receiving channel.

7. An enclosed input/output module as set forth in claim 5, wherein the connection elements located on the process connector are arranged on the front side of the process connector, and the multiple plug receptacles are correspondingly arranged on the back side of the process connector.

8. An enclosed input/output module as set forth in claim 1, wherein the module further comprises:
a tap hole accessible through and centrally located in the receiving channel; and
a threaded member arranged in the process connector, wherein said tap hole cooperates with the threaded member, the threaded member being axially immovably supported in the process connector.

9. An enclosed input/output module as set forth in claim 8, wherein the module further comprises:
an encoding element that is accessible in the receiving channel, and which is located around the tap hole; and
a counter-encoding element that is located adjacent the rear side of the process connector around the threaded member, wherein the encoding element cooperates with the counter-encoding element.

10. An enclosed input/output module as set forth in claim 9, wherein the encoding and counter-encoding elements are designed to be self-encoding.

11. An enclosed input/output module as set forth in claim 9, wherein the encoding and counter-encoding elements fit into one another in key-lock form in which a key bit joins the encoding and counter-encoding elements, said key bit jutting inwardly.

12. An enclosed input/output module as set forth in claim 1, wherein the module further comprises:
latching elements that are located on the upper and lower ends of the cover; and
latching recesses located on the process connector, wherein the latching elements interact with latching recesses in a prelatching position.

13. An enclosed input/output module as set forth in claim 12, wherein the latching recesses are beveled in such a way that the process connector can be released from its prelatching position without actuating a release element.

14. An enclosed input/output module as set forth in claim 1, wherein the module further comprises:
a tap hole accessible through and centrally located in the receiving channel;
a threaded member arranged in the process connector, wherein said tap hole cooperates with the threaded member, the threaded member being axially immovably supported in the process connector;
latching elements that are located on the cover; and
latching recesses that are located on the process connector and interact with the latching recesses in a prelatching position,
wherein the threaded member, tap hole, latching elements and latching recesses are dimensioned such that in the prelatching position the threaded member just extends into the tap hole at which point actuating the threaded member engages the process connector with the receiving channel.

15. An enclosed input/output module as set forth in claim 1, wherein the module further comprises:
at least one guide bar located on the side wall of the cover facing the receiving channel; and
at least one corresponding guide groove located on the process connector for every guide bar located on the cover, wherein the guide bar slidably engages the guide groove.

16. An enclosed input/output module as set forth in claim 15, wherein a guide bar is located on each side wall of the cover and the guide bars are designed differently so that the process connector is insertable in the receiving channel in only a single position.

17. An enclosed input/output module as set forth in claim 15, wherein a guide bar is located on each side wall of the cover and the guide bars are arranged asymmetrically so that the process connector is inserted in the receiving channel in only a single position.

18. An enclosed input/output module as set forth in claim 1, wherein the module further comprises:
a front cover that covers the receiving channel.

19. An enclosed input/output module as set forth in claim 18, wherein the front cover is a labeling mask.

20. An enclosed input/output module comprising:
an enclosure having side walls with exterior and interior surfaces, a back side and front side, wherein the enclosure is open on its front side;
at least one printed circuit board having two sides, the printed circuit board being arranged along one of the interior side wall surfaces of the enclosure;
a cover having an essentially U-shaped receiving channel and upper and lower ends and side walls, wherein a portion of each printed circuit board extends on a side of the receiving channel and the portion of the side of each printed circuit board facing the receiving channel is free of mounted components;
a process connector that fits within the receiving channel of the cover, the process connector having front and rear sides and providing connection elements to data lines;

light-emitting diodes that are arranged on the sides of each printed circuit board facing the corresponding adjacent interior surfaces of the enclosure, wherein said light-emitting diodes display the status of the signals that are transmitted through the data lines;

optical waveguides located on the cover that transfer the light emitted from the diodes forward;

multiple plug blocks that are located on the sides of each printed circuit board that face the interior of the enclosure;

contact blades that are arranged on the multiple plug blocks by inserting contact pins into each of the printed circuit boards and joining the contact blades with connecting elements that are also joined with the contact pins, the connecting elements protruding over the multiple plug blocks;

multiple plug receptacles having inner and outer sides and are located on the rear side of the process connector and engage the contact blades that are located on the multiple plug blocks and are correspondingly arranged with the connection elements located on the front side of the process connector;

recesses located on the outer sides of the multiple plug receptacles that correspond with the connecting elements arranged on the multiple plug blocks such that the process connector is in contact with the multiple plug blocks when the process connector is inserted into the receiving channel;

a tap hole accessible through and centrally located in the receiving channel;

a threaded member arranged in the process connector and axially immovably supported therein such that the tap hole cooperates with the threaded member;

an encoding element that is accessible in the receiving channel and located around the tap hole;

a counter-encoding element that is located adjacent the rear side of the process connector around the threaded member and cooperates with the encoding element, wherein the encoding and counter-encoding elements are designed to be self-encoding and wherein the encoding and counter-encoding elements fit into one another in key-lock form in which a key bit joins the encoding and counter-encoding elements, said key bit jutting inwardly;

latching elements located on the upper and lower ends of the cover;

latching recesses located on the process connector that interact in a prelatching position with the latching elements such that in the prelatching position the threaded member just extends into the tap hole at which point actuating the threaded member engages the process connector with the receiving channel;

at least one guide bar located on the side wall of the cover facing the receiving channel;

a guide groove on the process connector that corresponds with each guide bar and that slidably engages with each corresponding guide bar;

a front cover that covers the receiving channel.

21. A method for making an enclosed input/output module, the steps comprising:

arranging at least one printed circuit board that has two sides along the interior side wall surface of an enclosure having side walls with exterior and interior surfaces, a back and front side, wherein the enclosure is open on the front side;

arranging a cover over the printed circuit board, the cover having an essentially U-shaped receiving channel and upper and lower ends and side walls, wherein a portion of each printed circuit board extends on a side of the receiving channel and the side of the portion of each printed circuit board facing the receiving channel is free of mounted components;

arranging a process connector within the receiving channel of the cover, the process connector having front and rear sides and providing connection elements to data lines;

arranging light emitting diodes on the sides of each printed circuit board facing the corresponding adjacent interior surfaces of the enclosure, wherein the light-emitting diodes display the status of signals that are transmitted through the data lines;

arranging optical waveguides on the cover that transfer the light emitted from the diodes forwardly;

locating multiple plug blocks on the sides of each printed circuit board that face the interior of the enclosure;

arranging contact blades on the multiple plug blocks by inserting contact pins into the printed circuit boards and joining the contact blades with connecting elements that are also joined with the contact pins, the connecting elements protruding over the multiple plug blocks;

locating multiple plug receptacles that have inner and outer sides on the rear side of the process connector and engage the contact blades on the multiple plug blocks and are arranged to correspond with the connection elements located on the front side of the process connector;

locating recesses on the outer sides of the multiple plug receptacles that correspond with the connecting elements such that the process connector is in contact with the multiple plug blocks when the process connector is inserted into the receiving channel;

locating a tap hole centrally in the receiving channel;

arranging a threaded member in the process connector and supporting it such that it is axially immovable therein, wherein the tap hole cooperates with the threaded member;

locating an encoding element in the receiving channel around the tap hole, locating a counter-encoding element adjacent the rear side of the process connector around the threaded member such that the counter-encoding element cooperates with the encoding element, wherein the encoding and counter-encoding elements are designed to be self-encoding and wherein the encoding and counter-encoding elements fit into one another in key-lock form in which a key bit joins the encoding and counter-encoding elements, said key bit jutting inwardly;

locating latching elements on the upper and lower ends of the cover;

locating latching recesses on the process connector that interact in a prelatching position with the latching elements such that in the prelatching position the threaded member just extends into the tap hole at which point actuating the threaded member engages the process connector with the receiving channel;

locating at least one guide bar on the side wall of the cover facing the receiving channel;

locating a guide groove on the process connector that corresponds with each guide bar such that each guide bar slidably engages with the corresponding guide bar; and covering the receiving channel with a front cover.

* * * * *